US010297701B2

(12) United States Patent
Balasekaran et al.

(10) Patent No.: US 10,297,701 B2
(45) Date of Patent: May 21, 2019

(54) OPTICAL SWITCHING DEVICE, OPTICAL SWITCHING APPARATUS

(71) Applicant: SUMITOMO ELECTRIC INDUSTRIES, LTD., Osaka (JP)

(72) Inventors: Sundararajan Balasekaran, Yokohama (JP); Kohei Miura, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/883,769

(22) Filed: Jan. 30, 2018

(65) Prior Publication Data

US 2018/0219114 A1     Aug. 2, 2018

(30) Foreign Application Priority Data

Feb. 2, 2017   (JP) ................. 2017-017593

(51) Int. Cl.
| G02B 6/26 | (2006.01) |
| H01L 31/0352 | (2006.01) |
| H01L 31/024 | (2014.01) |
| H01L 31/109 | (2006.01) |
| H01L 31/0304 | (2006.01) |
| H01L 31/105 | (2006.01) |
| H01L 31/18 | (2006.01) |

(52) U.S. Cl.
CPC .... *H01L 31/035236* (2013.01); *H01L 31/024* (2013.01); *H01L 31/0304* (2013.01); *H01L 31/105* (2013.01); *H01L 31/109* (2013.01); *H01L 31/184* (2013.01)

(58) Field of Classification Search
None
See application file for complete search history.

(56) References Cited

U.S. PATENT DOCUMENTS

| 4,818,079 A * | 4/1989 | Maserjian ............ B82Y 20/00 |
| | | 257/E31.033 |
| 10,129,613 B2 * | 11/2018 | Balasekaran ....... G02F 1/01716 |
| 2010/0327278 A1 * | 12/2010 | Ahn ..................... B82Y 20/00 |
| | | 257/43 |
| 2011/0133088 A1 * | 6/2011 | Albo ..................... B82Y 20/00 |
| | | 250/338.4 |
| 2015/0364628 A1 * | 12/2015 | Nozawa ............. H01L 31/0304 |
| | | 136/255 |

OTHER PUBLICATIONS

N. Gautam et al, Band engineered HOT mildwave infrared detectors based on type-II InAs/GaSb strained layer superlattices, *Infrared Physics & Technology*, (2013), p. 1-p. 6.

* cited by examiner

*Primary Examiner* — Ali Naraghi
(74) *Attorney, Agent, or Firm* — Smith, Gambrell & Russell LLP.

(57) ABSTRACT

An optical switching device includes: an optical absorbing layer having a first superlattice structure and responding to an incident light; an excitation layer having a second superlattice structure and producing an electron by thermal excitation; and a barrier layer having a third superlattice structure, the optical absorbing layer and the barrier layer enabling a first band offset and a second band offset to form a well in a conduction band of the second superlattice structure of the excitation layer with reference to a conduction band of the first superlattice structure of the optical absorbing layer and a conduction band of the third superlattice structure of the barrier layer, respectively.

6 Claims, 8 Drawing Sheets

OPTICAL SWITCHING DEVICE, OPTICAL SWITCHING APPARATUS

BACKGROUND OF THE INVENTION

Field of the Invention

The present invention relates to an optical switching device and an optical switching apparatus. This application claims the benefit of priority from Japanese Patent Application No. 2017-017593 filed on Feb. 2, 2017, which is herein incorporated by reference in its entirety.

Related Background Art

N. Gautam et. al., "Band engineered HOT midwave infrared detectors based on type-II InAs/GaSb strained layer superlattices", Infrared Physics & Technology, Volume 59, pp. 72-77 (2013), which is referred to as Non-Patent document 1, discloses a mid infrared photodiode.

SUMMARY OF THE INVENTION

An optical switching device according to one aspect of the present invention includes: an optical absorbing layer having a first superlattice structure and responding to an incident light; an excitation layer having a second superlattice structure and producing an electron by thermal excitation; and a barrier layer having a third superlattice structure, the optical absorbing layer and the barrier layer enabling a first band offset and a second band offset to form a well in a conduction band of the second superlattice structure of the excitation layer with reference to a conduction band of the first superlattice structure of the optical absorbing layer and a conduction band of the third superlattice structure of the barrier layer, respectively.

An optical switching apparatus according to another aspect of the present invention includes: an optical switching device; and a temperature-adjusting device thermally coupled to the optical switching device. The optical switching device includes: an optical absorbing layer having a first superlattice structure and responding to an incident light; an excitation layer having a second superlattice structure and producing an electron by thermal excitation; and a barrier layer having a third superlattice structure, the optical absorbing layer and the barrier layer enabling a first band offset and a second band offset to form a well in a conduction band of the second superlattice structure of the excitation layer with reference to a conduction band of the first superlattice structure of the optical absorbing layer and a conduction band of the third superlattice structure of the barrier layer, respectively.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

DESCRIPTION OF THE EMBODIMENTS

The photodiode in Non-Patent Document 1 includes a p-type contact layer, an electron-blocking layer, a light absorbing layer, a hole-blocking layer, and an n-type contact layer. The photodiode allows the light absorbing layer to generate photo-excited electrons, which pass through the hole blocking layer to the n-type contact layer, and outputs photocurrent.

Inventors' studies reveal that an optical switching device operable to switch photocurrent in response to change in operating temperature is useful. Specifically, such an optical switching device receives an incident light beam, which the light absorbing layer thereof can detect, to generate photocurrent, and can open and close a gate in response to change in ambient temperature of the optical switching device to control the output of the photocurrent.

It is an object according to one aspect of the present invention to provide a light switching device operable to switch the output of photocurrent in response to change in ambient temperature thereof. It is an object according to another aspect of the present invention to provide a light switching apparatus including the light switching device.

Embodiments according to the present above aspects will be described below.

An optical switching device according to an embodiment includes: (a) an optical absorbing layer having a first superlattice structure and responding to an incident light; (b) an excitation layer having a second superlattice structure and producing an electron by thermal excitation depending upon operating temperature of the optical switching device; and (c) a barrier layer having a third superlattice structure, the optical absorbing layer and the barrier layer enabling a first band offset and a second band offset to form a well in a conduction band of the second superlattice structure of the excitation layer with reference to a conduction band of the first superlattice structure of the optical absorbing layer and a conduction band of the third superlattice structure of the barrier layer, respectively.

The optical switching device provides the excitation layer with mid-levels, which allows thermally excitation to transfer electrons to the conduction of the second superlattice structure of the excitation layer depending upon operating temperature of the optical switching device, in the bandgap between the conduction and valence bands of the second superlattice structure. The thermal excitation causes electrons, trapped in the levels, to move to the conduction band depending upon the ambient temperature of the optical switching device. The levels in the excitation layer are distributed in energy. The distribution of the levels in energy allows the number of levels activated by the thermal excitation among the levels to change with the ambient temperature. According to this distribution, change in the ambient temperature is associated with the number of carriers pumped from the thermally activated levels to the conduction band of the second superlattice structure. The conduction band of the second superlattice structure in the excitation layer is made low with respect to both the conduction band of the first superlattice structure of the light absorbing layer and the conduction band of the third superlattice structure of the barrier layer, so that the excitation layer forms a well. This well can confine the electrons that are thermally excited from the levels to the conduction band of the second superlattice structure. Electrons in the conduction band of the second superlattice structure (electrons in the well) are relaxed to transfer to energy levels lower than the conduction band. The balance of the excitation and the relaxation can form an accumulation state where the excitation overcomes the relaxation and a depletion state where the relaxation overcomes the excitation. In the accumulation state, the well (the well of the excitation layer) contains more electrons, and in the depletion state, the well (the well of the excitation layer) contains few electrons. Switching of one of the accumulation and depletion states to the other is associated with the distribution of the levels in energy. In both the accumulation and depletion states, the incident light causes the light absorbing layer to generate photocurrent carriers by excitation of electrons from the valence band to the conduction band of the first superlattice structure. The excitation layer in the accumulation state that accumulates the more electrons allows almost all the photocurrent carriers to flow across the excitation layer, so that the optical switching device outputs photocurrent produced from the photocurrent carriers that flow thereacross. The excitation layer in the depletion state hinders almost all of photocurrent carriers from flowing across the excitation layer because the photocurrent carriers lose their energies by collision therein and fall into the well (the excitation layer acting as a well), so that the optical switching device output less photocurrent in response to light incidence. The optical switching device operates differently in the accumulation and depletion states depending upon the temperature change, and switches the output of the photocurrent.

In the optical switching device according to an embodiment, the second superlattice structure of the excitation layer includes an InSb/InAs/GaSb structure.

This optical switching device provides the light absorbing layer with the InSb/InAs/GaSb structure to generate photocurrent carriers in response to light in a desired mid-infrared wavelength region. The superlattice structure of the light absorbing layer can form a barrier effective in providing a well which can capture photocurrent carriers.

In the optical switching device according to an embodiment, the third superlattice structure of the barrier layer includes one of an InSb/InAs/GaSb/AlSb/GaSb structure and an InSb/InAs/GaSb structure.

This optical switching device provides the excitation layer with the InSb/InAs/GaSb/AlSb/GaSb or InSb/InAs/GaSb structure to form a well. The optical switching device allows the excitation layer to generate electrons by thermal excitation which depends upon the ambient temperature, and the well in the excitation layer can accumulate the thermally excited carriers.

In the optical switching device according to an embodiment, the third superlattice structure of the barrier layer includes an InSb/InAs/GaSb structure.

In this optical switching device, the InSb/InAs/GaSb structure of the excitation layer forms a well. The optical switching device allows the excitation layer to generate electrons by thermal excitation which depends upon the ambient temperature and to accumulate the thermally excited carriers in the well thereof.

An optical switching apparatus according to an embodiment includes: (a) an optical switching device; and (b) a temperature-adjusting device thermally coupled to the optical switching device. The optical switching device includes: an optical absorbing layer having a first superlattice structure and responding to an incident light; an excitation layer having a second superlattice structure and producing an electron by thermal excitation depending upon operating temperature of the optical switching device; and a barrier layer having a third superlattice structure, the optical absorbing layer and the barrier layer enabling a first band offset and a second band offset to form a well in a conduction band of the second superlattice structure of the excitation layer with reference to a conducution band of the first superlattice of the optical absorbing layer and a conduction band of the third superlattice structure of the barrier layer, respectively.

In the optical switching apparatus, the temperature-adjusting device is thermally coupled to the optical switching device and can change the temperature thereof. The optical switching apparatus allows the optical switching device to operate differently in two internal states, i.e., the accumulation and depletion states, enabled by the distribution of levels in the optical switching device and the temperature of the temperature adjusting device (the temperature of the optical switching device), thereby turning on or off the photocurrent.

The optical switching apparatus according to an embodiment further includes an optical fiber optically coupled to the optical switching device.

This optical switching apparatus allows the light input fiber to supply incident light to the optical switching device.

Teachings of the present invention can be readily understood by considering the following detailed description with reference to the accompanying drawings shown as examples. Referring to the accompanying drawings, an optical switching device and an optical switching apparatus according to the present embodiments will be described below. To facilitate understanding, identical reference numerals are used, where possible, to designate identical elements that are common to the figures.

Figure 1:
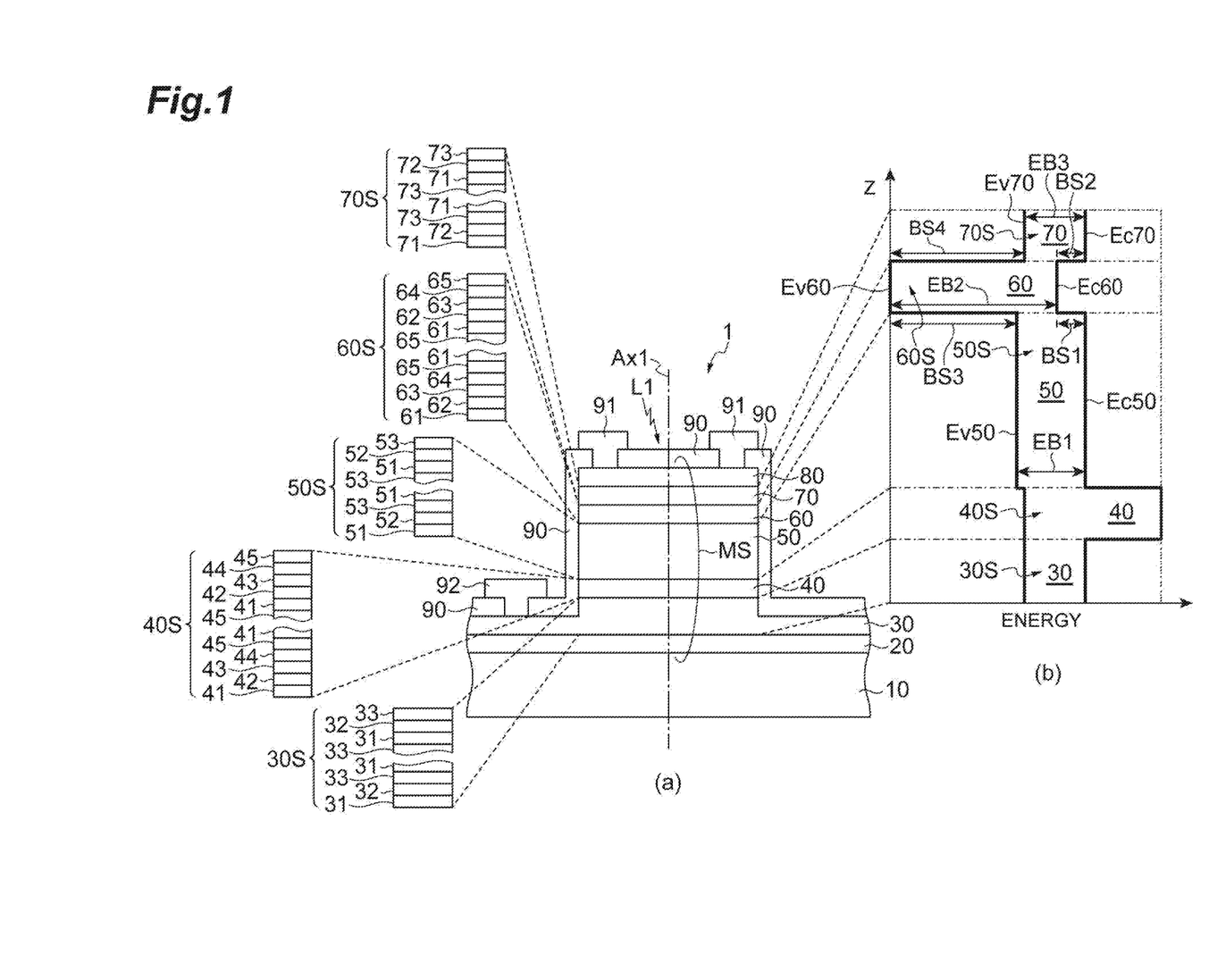
FIG. 1 is a schematic view showing an optical switch according to an embodiment.

FIG. 1 is a schematic view showing an optical switching device according to the present embodiment. Specifically, FIG. 1 schematically shows a laminate structure of the optical switching device in Part (a), and shows, in Part (b), the band diagram of conduction and valence bands in the optical switching device according to the embodiment.

The optical switching device 1 includes a light absorbing layer 50, an excitation layer 60, and a barrier layer 70, which are arranged along the direction of the first axis Ax1. The excitation layer 60 is disposed between the light absorbing layer 50 and the barrier layer 70. The light absorbing layer 50 has a first superlattice structure 50S of a type-II band structure, and is sensitive to incident light L1. The excitation layer 60 has a second superlattice structure 60S of a type-II band structure, and generates carriers by thermal excitation according to the operating temperature of the optical switching device 1. The barrier layer 70 has a third superlattice structure 70S of a type-II band structure.

Figure 2A:
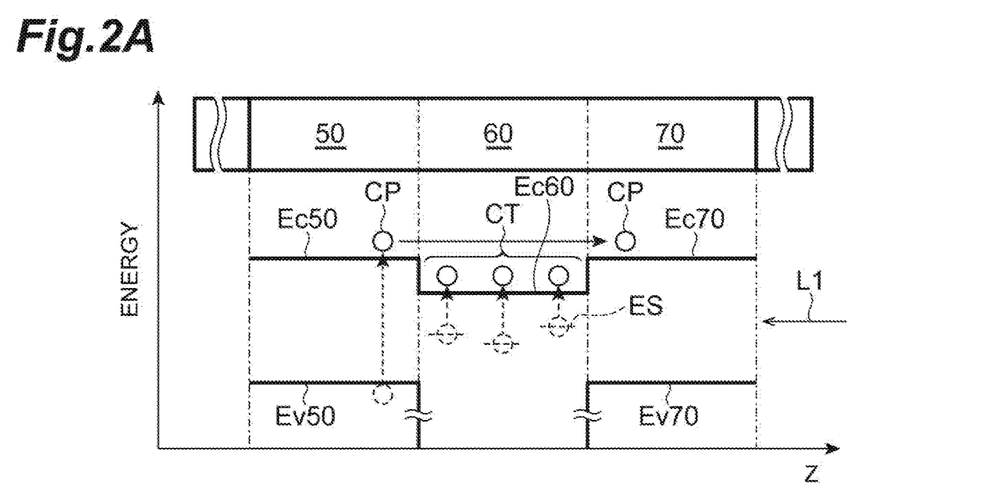
FIG. 2A is a schematic view showing the conduction bands of the light absorbing layer, the excitation layer and the barrier layer according to the embodiment.
Figure 2B:
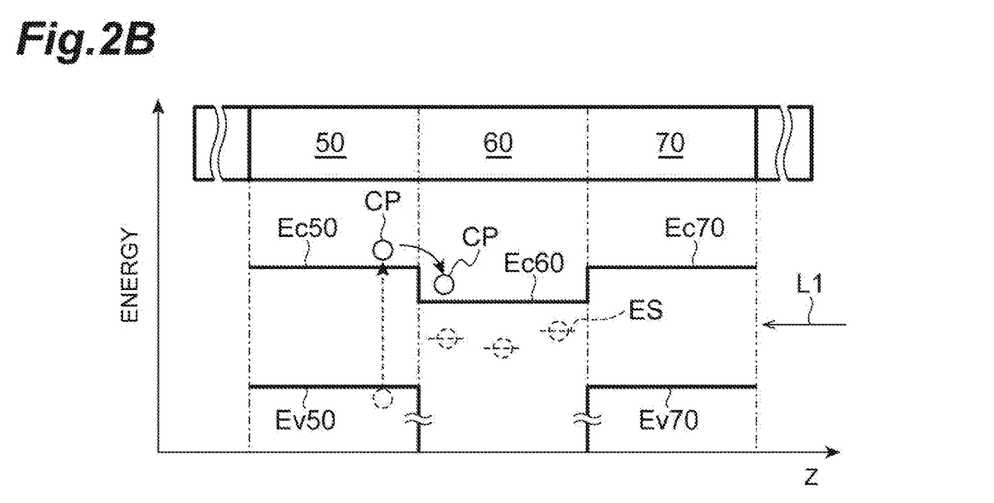
FIG. 2B is a schematic view showing the conduction bands of the light absorbing layer, the excitation layer and the barrier layer according to the embodiment.

As shown in Part (b) of FIG. 1, the second superlattice structure 60S of the excitation layer 60 has a conduction band Ec60 lower than the conduction band Ec50 of the first superlattice structure 50S of the light absorbing layer 50. The conduction band Ec60 is lower than the conduction band Ec70 of the third superlattice structure 70S of the barrier layer 70. The light absorbing layer 50 and the barrier layer 70 can make a first band offset BS1 and a second band offset BS2, respectively, which can form a well in the conduction band Ec60 with reference to both the conduction band Ec50 of the first superlattice structure 50S and the conduction band Ec70 of the third superlattice structure 70S.
Exemplary First and Second Band Offsets BS1 and BS2
First band offset BS 1: 30 to 50 meV
Second band offset BS 2: 30 to 50 meV The second superlattice structure 60S of the excitation layer 60 has a valence band Ev60, which is lower than the valence band Ev50 of the first superlattice structure 50S of the light absorbing layer 50, and the light absorbing layer 50 forms a third band offset BS3 with reference to the valence band Ev60. The valence band Ev60 of the second superlattice structure 60S is lower than the valence band Ev70 of the third superlattice structure 70S. The barrier layer 70 forms a fourth band offset BS4 with reference to the valence band Ev60.
Exemplary Third and Fourth Band Offsets BS3 and BS4
Third band offset BS3: 250 to 270 meV
Fourth band offset BS4: 250 to 270 meV FIGS. 2A and 2B show schematic views each showing the conduction band diagram of the light absorbing layer, the excitation layer and the barrier layer according to the embodiment. As shown in FIGS. 2A and 2B, the excitation layer 60 contains levels ES, which can generate electrons, which are within the bandgap between the conduction band Ec60 and the valence band Ev60 of the second superlattice structure 60S of the excitation layer 60, by thermal excitation, and specifically, electrons trapped in the levels ES are thermally excited to the conduction band Ec60 according to the ambient temperature. The levels ES of the excitation layer 60 is distributed in energy. The distribution in energy allows the number of levels thermally activated among the levels ES to vary depending upon the ambient temperature, so that the number of carriers thermally excited from the levels ES to the conduction band Ec60 of the second superlattice structure 60S can vary according to the ambient temperature. As described above, the conduction band Ec60 of the second superlattice structure 60S is made lower with respect to both the conduction band Ec50 of the first superlattice structure 50S of the light absorbing layer 50 by the first band offset BS1 and the conduction band Ec70 of the superlattice structure 70S by the second band offset ES2, so that the excitation layer 60 forms a well. This well confines thermally excited electrons, which are supplied from the levels ES to the conduction band Ec60 of the second superlattice structure 60S. Electrons (electrons in the well) in the conduction band Ec60 of the second superlattice structure 60S are relaxed to transit to lower energy levels. Exemplary steady states associated with the excitation and the relaxation include an accumulation state (in FIG. 2A) where the excitation overcomes the relaxation and a depletion state where the relaxation overcomes the excitation (in FIG. 2B).

As shown in FIGS. 2A and 2B, in the accumulation state, the well (the well of the excitation layer 60) accumulates a large number of electrons, and in the depletion state, the well (the well of the excitation layer 60) accumulates a small number of electrons. Switching between the accumulation state and the depletion state is associated with the distribution of the levels in terms of energy. In both the accumulation and depletion states, the incident light L1 allows the light absorbing layer 50 to generate photocurrent carriers CP by the excitation of electrons from the valence band Ev50 to the conduction band Ec50 of the first superlattice structure 50S. In the accumulation state, the photocurrent carriers CP flow across the excitation layer 60 that accumulates a large number of carriers. The optical switching device 1 outputs photocurrent, which corresponds to the photocurrent carriers CP that flow thereacross. Specifically, in the optical switching device 1, the incident light L1 enables excitation from the valence band Ev50 to the conduction band Ec50 of the first superlattice structure 50S in the light absorbing layer 50, so that the light absorbing layer 50 can generate photocurrent carriers CP. These photocurrent carriers CP flow across the excitation layer 60 which is filled with the thermally excited carriers CT, the optical switching device 1 emits photocurrent produced from the flowing photocurrent carriers CP.

As shown in FIG. 2B, in the depletion state, the photocurrent carriers CP lose their energies by collision caused in the excitation layer 60, thereby being captured in a well (a well of the excitation layer 60), so that the optical switching device 1 cannot output the photocurrent that corresponds to the amount of incident light. In this manner, the accumulation and depletion states are effective in switching the output of the photocurrent in response to the temperature change. Specifically, the well of the excitation layer 60 that is not filled with thermally excited carriers CT can capture the photocurrent carriers CP because of loss of energy caused by collision in the excitation layer 60. The optical switching device 1 outputs less photocurrent in response to the incidence of the incident light L1.

As already described, the levels ES are varied in energy. The optical switching device 1 can operate in such a temperature range that the distribution does not decrease with increasing energy. The temperature range is, for example, a range of 50 to 90 degrees in absolute temperature. Thermal energies in the temperature range cannot substantially excite carriers from the valence band Ev60, and allows the dominant excitation to occur from the distributed levels ES. An exemplary range of temperature and the distribution of the levels ES Distribution Range of Levels ES: 150 to 240 meV, 100 to 150 K The first superlattice structure 50S, the second superlattice structure 60S, and the third superlattice structure 70S that can form a well may include, for example, the following semiconductors. Referring to FIG. 1 again, one of the group III-V semiconductor thin films in the first superlattice structure 50S, the second superlattice structure 60S and the third superlattice structure 70S contains Sb as a group V element, and further, for example, As as a group V element, and contains at least one of, for example, In, Ga or Al as a group III element. Another of the group III-V semiconductor thin films contains at least one of, for example, Sb or As as a group V element, and contains at least one of, for example, In, Ga, or Al as a group III element. The group III-V semiconductor thin films each contain constituent elements that can form the type-II band structure in the superlattice structure.

The first superlattice structure 50S of the light absorbing layer 50 has a first bandgap EB1 defined as an interval in energy between the conduction band Ec50 and the valence band Ev50. An energy and light wavelength of an exemplary first band gap EB1
First Band Gap EB1: 200 to 225 meV, 5.5 to 6 Micrometers The first superlattice structure 50S includes a stack of first unit structures, and each of the first unit structures includes, for example, an array of group III-V semiconductor thin films having different bandgaps. The first unit structures are arranged to form a first bandgap EB1. Specifically, each first unit structure of the light absorbing layer 50 includes a GaSb layer 51, an InAs layer 52, and an InSb layer 53, and the stack of the first unit structures forms the first superlattice structure 50S. Specifically, the first superlattice structure 50S may include, for example, an InSb/InAs/GaSb structure, which can provide the light absorbing layer 50, which is sensitive to light in desired mid-infrared wavelengths. In addition, the first superlattice structure 50S can provide the light absorbing layer 50 with a barrier effective in forming the well of the excitation layer 60. The stacking number of the first unit structures for the first superlattice structure 50S of the light absorbing layer 50 is in a range of 160 to 240, for example, 200. All or a part of the GaSb layers 51, the InAs layers 52, and the InSb layers 53 are doped with p-type dopant, such as Be, so that the light absorbing layer 50 has p-type conductivity. The p-type dopant concentration of the light absorbing layer 50 can be $0.1 \times 10^{16}$ to $1 \times 10^{16}$ cm$^{-3}$, where "x" represents multiplication.

The second superlattice structure 60S of the excitation layer 60 has a second band gap EB2 defined as an interval in energy between the conduction band Ec60 and the valence band Ev60. An energy and temperature representing an exemplary second band gap EB2
Second Bandgap EB2: 400 to 450 meV, 100 to 150 K The second superlattice structure 60S includes a stack of second unit structures, and each of the second unit structures includes, for example, an array of group III-V semiconductor thin films having different bandgaps. Specifically, the second unit structure for the excitation layer 60 may include a GaSb layer 61, an AlSb layer 62, a GaSb layer 63, an InAs layer 64, and an InSb layer 65, and alternatively the second unit structure for the excitation layer 60 may include, for example, a GaSb layer, an InAs layer, and an InSb layer. The stack of the second unit structures constitutes the second superlattice structure 60S. Specifically, the second superlattice structure 60S may include an InSb/InAs/GaSb/AlSb/GaSb structure and/or an InSb/InAs/GaSb structure. The InSb/InAs/GaSb/AlSb/GaSb structure and the InSb/InAs/GaSb structure can provide a band offset effective in forming a well in the excitation layer 60. The stacking number of the second unit structures in the second superlattice structure 60S of the excitation layer 60 is in a range of 50 to 100, for example, 100. All or a part of semiconductor thin films constituting the stack of the second unit structures are doped with n-type dopant, such as Si, so that the excitation layer 60 has n-type conductivity. The n-type dopant concentration of the excitation layer 60 can be $1 \times 10^{17}$ to $1 \times 10^{18}$ cm$^{-3}$. The donor level of an n-type dopant, Si, is in a range of 150 to 300 meV with reference to the conduction band of the second superlattice structure 60S.

The third superlattice structure 70S of the barrier layer 70 has a third bandgap EB3 defined as an interval in energy between the conduction band Ec70 and the valence band Ev70.

An energy and light wavelength representing an exemplary third bandgap EB3
Third Bandgap EB3: 200 to 225 meV, 5.5 to 6 Micrometers The third superlattice structure 70S includes a stack of third unit structures, and each of the third unit structures includes, for example, an array of III-V semiconductor thin films having different band gaps. The third unit structures are arranged to form a third bandgap EB3. Specifically, each of the third unit structures for the barrier layer 70 includes a GaSb layer 71, an InAs layer 72, and an InSb layer 73, and the stack of the third unit structures constitutes the third superlattice structure 70S. Specifically, the third superlattice structure 70S may include an InSb/InAs/GaSb structure. The InSb/InAs/GaSb structure for the barrier layer 70 can also provide a barrier effective in forming the well. The stacking number of the third unit structures in the third superlattice structure 70S of the barrier layer 70 is in a range of 40 to 60, for example, 50. The dopant concentration, for example, the Si dopant concentration in the third superlattice structure 70S of the barrier layer 70 can be in a range of $1 \times 10^{17}$ to $5 \times 10^{17}$ cm$^{-3}$.

The light absorbing layer 50 is in contact with the excitation layer 60, and the excitation layer 60 is in contact with the barrier layer 70. A pn-junction is disposed near the boundary between the light absorbing layer 50 and the excitation layer 60.

Example 1

Figure 3:
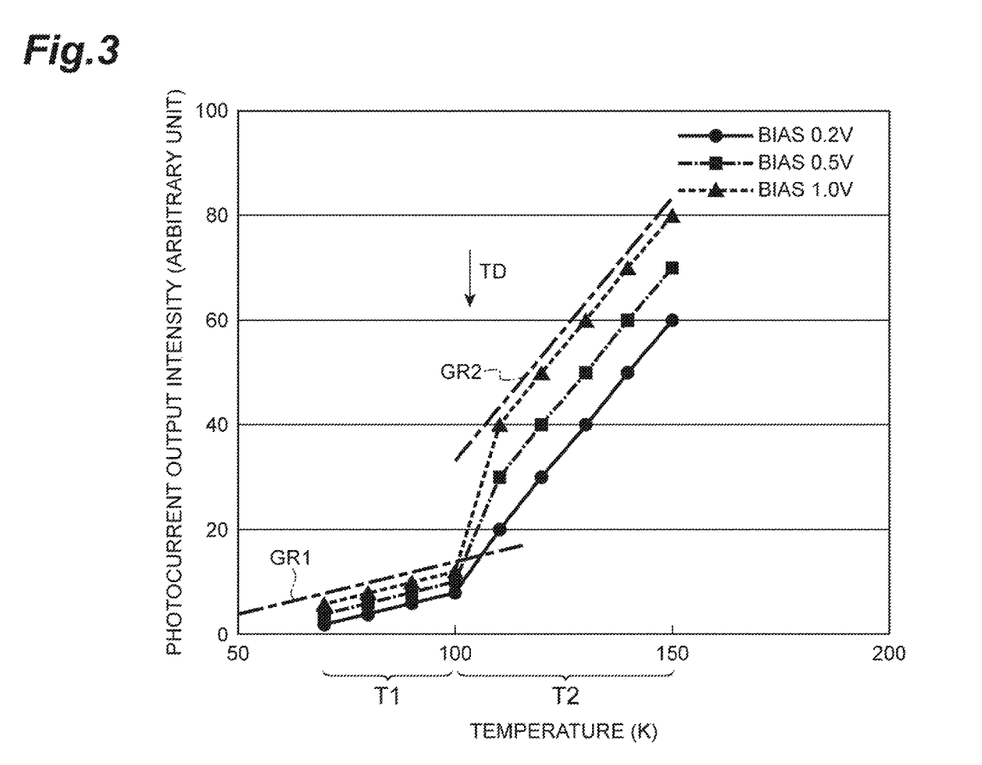
FIG. 3 is a graph showing the relationship between the photocurrent characteristics and the ambient temperature of the device according to the embodiment.

FIG. 3 is a graph showing the relationship between the operating temperature and the output intensity of the photocurrent in the device structure for the optical switching device according to the example.
Exemplary Semiconductor Layers of a Device Structure for Optical Switching Device 1
Light absorbing layer 50
Be concentration: around $1 \times 10^{16}$ cm$^{-3}$
Stacking number of unit structures: around 200
Thickness of the superlattice structure: around 1000 nm
Excitation layer 60
Si-doped GaSb/Si-doped AlSb/Si-doped GaSb/Si-doped InAs/Si-doped InSb
Si concentration: around $1 \times 10^{17}$ cm$^{-3}$
Stacking number of unit structures: 100
Thickness of superlattice structure: 300 to 500 nm
Barrier layer 70: GaSb (a thickness of 3.35 nm)/Si-doped InAs (a thickness of 2.12 nm)/Si-doped InSb (a thickness of 0.23 nm)
Si concentration: $1 \times 10^{17}$ to $5 \times 10^{17}$ cm$^{-3}$
Stacking number of unit structures: 50
Thickness of the superlattice structure: 250 nm These semiconductor layers are disposed in the semiconductor mesa. As shown in FIGS. 2A and 2B, with respect to the light absorbing layer 50 and the barrier layer 70, the excitation layer 60 forms a well.
First band offset BS1: 30 to 50 meV
Second band offset BS2: 30 to 50 meV The device structure according to the first example includes a first electrode 91 and a second electrode 92, which are disposed in the optical switching device 1 shown in FIG. 1. In order to measure current flowing through the ammeter connected between the first and second electrodes 91 and 92, voltage is applied across these electrodes, and current is measured in a range of 70 to 150 K in absolute temperature. The applied voltages are 0.2, 0.5, and 1.0 volt (V). The semiconductor mesa is irradiated with the incident light L1 at the upper face thereof, and the incident light L1 propagates through the light absorbing layer 50, the excitation layer 60 and the barrier layer 70. The wavelength of the light is in a range of 2 to 6 micrometers.

As shown in FIG. 3, at a certain temperature, the photocurrent increases with an increase in the voltage applied to the device structure according to Example 1. Photocurrent characteristics at any applied voltage increase with rise in temperature of the device structure. Specifically, in the range of about 70 to 100 Kelvin, the current linearly varies at the first gradient GR1, and is substantially proportional to absolute temperature. In the range from about 100 to 150 Kelvin, the current linearly varies at the second gradient GR2, which is larger than the first gradient GR1, and is substantially proportional to absolute temperature. At around 100 Kelvin, a large transition is observed in the photocurrent characteristics, and the photocurrent characteristics of any applied voltages (0.2, 0.5 and 1.0 V) have similar transitions. The transition temperatures of photocurrent characteristics have less dependence upon the applied voltages (0.2, 0.5, and 1.0 V). The current characteristics varying at the first gradient GR1 is less dependent upon the intensity of the irradiation light in the above temperatures. These experimental results show that the transitions in the current characteristics are associated with the internal structure of the device structure.

Inventors' studies reveal that electric current increasing with temperature at a substantially constant gradient correlates with the intensity of light irradiated and accordingly is generated by optical excitation. The wavelength of incident light used in the measurement shown in FIG. 3 is in a range of wavelength enabling interband transition in the light absorbing layer 50 and is not in a range of wavelength enabling interband transition in the excitation layer 60. Electric current observed in a temperature range of about 100 to 150 Kelvin, which is generated by the incident light, can be photocurrent. Electric current changing with temperature at a second gradient GR2 correlates with the intensity of the irradiation light in a temperature range of about 100 to 150 Kelvin.

When attention is paid to the fact that the excitation layer 60 forms a well with respect to the light absorbing layer 50 and the barrier layer 70, the well works to trap electrons flowing from the light absorbing layer 50 to the barrier layer 70. The current characteristics in the temperature range of higher than 100 Kelvin, however, are unlikely to show that the well captures electrons. The current characteristics are likely to show something to accumulate in the well.

Inventors' further studies based on the present and other experiments reveal that the excitation layer 60 of the superlattice structure has levels, which are formed in the bandgap and can trap electrons, within the temperature range of 150 K from the conduction band and that these levels are distributed not only spatially over the excitation layer 60 but also over the above energy range.

Figure 4A:
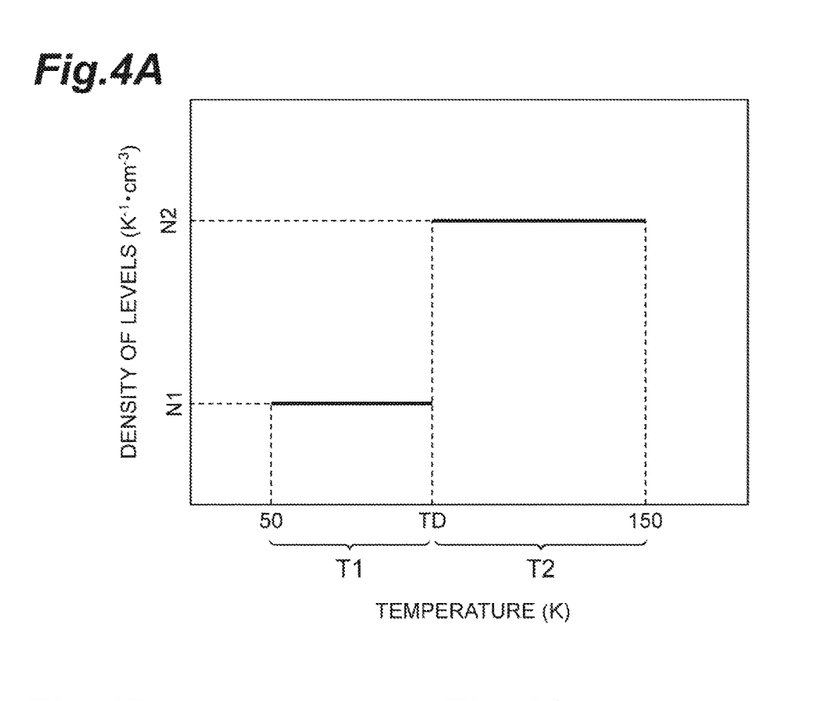
FIG. 4A is a graph showing an exemplary relationship between the concentration of levels in the excitation layer and the energy (temperature) with reference to the bottom energy of the conduction band in the device according to the embodiment.
Figure 4B:
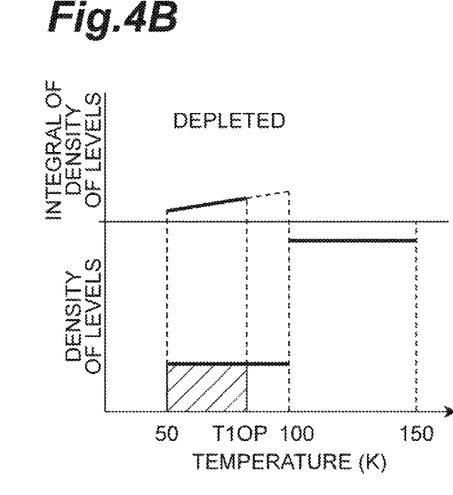
FIG. 4B is a schematic view showing a depletion state in the excitation layer of the device according to the embodiment.
Figure 4C:
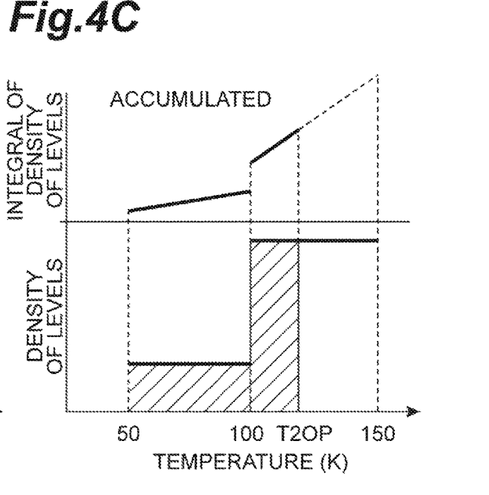
FIG. 4C is a schematic view showing an accumulation state in the excitation layer of the device according to the embodiment.

FIGS. 4A, 4B, and 4C are views each showing the relationship between the level density and temperature of the device structure in the optical switching device according to the embodiment. The inventors estimate the distribution of levels in energy from the electric current characteristics shown in FIG. 3. FIG. 4A shows an estimate of the level distribution, where the horizontal axis represents temperature (in Kelvin), and the vertical axis represents the density of levels per unit volume and energy.

At a first temperature T1OP within the temperature range of 70 to 100 Kelvin, the hatched region in FIG. 4B indicates levels that can be thermally activated and participate in thermal excitation to the well of the device structure to generate photocurrent. The area of the hatch region represents the sum of the number of levels that can contribute to the thermal excitation, and this number of levels changes monotonically with the temperature rise at the first gradient GR1.

At a second temperature T2OP within the temperature range of 100 to 150 Kelvin, the hatched region in FIG. 4C indicates levels that can be thermally activated and participate in thermal excitation to the well of the device structure to generates photocurrent. The area of the hatched region represents the sum of the number of levels that can contribute to thermal excitation, and this number of levels changes monotonically with the temperature rise at the first gradient GR2 in a temperature range of 100 Kelvin or more. This thermal excitation causes the well to accumulate a large number of thermally excited electrons, and the accumulated electrons hinder the well from capturing photocurrent. This distribution of levels provides the excitation layer with such an internal structure. These levels are likely to be from impurities in the excitation layer on the ground of the inventors' studies.

These results in FIGS. 4A, 4B, and 4C indicate that the levels in the bandgap are distributed in the energy range of 70 to 150 Kelvin in temperature, and the current characteristics based upon the level distribution also indicate transitions around a temperature (referred to as the transition temperature TD) within a range of 70 to 150 Kelvin.

Referring to FIG. 4A, a distribution (N1) of levels, which has one constant density of levels, is shown in the temperature range of 70 Kelvin to the transition temperature TD, and a distribution (N2) of levels, which has another constant density of levels, is shown in the temperature range of the transition temperature TD to 150 K. The two constant distributions (N1) and (N2) of levels are derived from the experiments, and the actual distributions each may have a fine structure. In view of the experiments, the inventors have obtained the following level distributions: the maximum of the level distribution in energy in the temperature range from 70 Kelvin to the transition temperature TD is smaller than the minimum of the level distribution in energy in the temperature range of the temperature TD to 150 Kelvin, and the absolute value of the difference between the minimum and the maximum is larger than zero.

Referring again to FIG. 1, the optical switching device 1 will be described below. The optical switching device 1 further includes a p-type buffer layer 20, a first superlattice layer 30, a second superlattice layer 40, and an n-type cap layer 80. The p-type buffer layer 20, the first superlattice layer 30, the second superlattice layer 40, the light absorbing layer 50, the excitation layer 60, the barrier layer 70, and the n-type cap layer 80 are arranged in order on the principal surface of the substrate 10 in the direction of the first axis Ax1.

The substrate 10 includes a III-V semiconductor, for example, Te-doped GaSb. The p-type buffer layer 20 includes, for example, Be-doped GaSb. The n-type cap layer 80 includes a group III-V semiconductor, for example, Si-doped InAs.

The first superlattice layer 30 includes, for example, a group III-V semiconductor superlattice structure 30S of a type-II band structure, which includes an arrangement of unit structures each containing III-V semiconductor thin films, and the unit structures each include, for example, a Be-doped GaSb layer 31, a Be-doped InAs layer 32, and a Be-doped InSb layer 33, and are stacked in the direction of the first axis Ax1. The stacking number of unit structures is, for example, 50.

The second superlattice layer 40 includes, for example, a group III-V semiconductor superlattice structure 40S of a type II band structure, which includes an arrangement of unit structures each containing III-V semiconductor thin films, and the unit structures each include, for example, an undoped GaSb layer 41, an undoped InAs layer 42, an undoped GaSb layer 43, an undoped InAs layer 44, and an undoped InSb layer 45, and are stacked in the direction of the first axis Ax1. The stacking number of the unit structures is, for example, 16.

The optical switching device 1 further includes a protective film 90. The protective film 90 can cover the surface of the semiconductor mesa MS of the optical switching device 1. The semiconductor mesa MS includes a p-type buffer layer 20, a first superlattice layer 30, a second superlattice layer 40, a light absorbing layer 50, an excitation layer 60, a barrier layer 70, and an n-type cap layer 80. The first electrode 91 is connected to the n-type cap layer 80 through one opening of the protective film 90, and the second electrode 92 is connected to the p-type buffer layer 20 through another opening of the protective film 90. In the optical switching device 1, the top face of the semiconductor mesa MS receives incident light L1 through the protective film 90.

If necessary, the p-type and n-type conductivity types of the optical switching device 1 may be replaced with respective opposite conductivity types. Such an optical switching device 1 can include an n-type buffer layer, a barrier layer, an excitation layer, a light absorbing layer, a second superlattice layer, a first superlattice layer, and a p-type cap layer, which are formed in order on the principal surface. Specifically, the optical switching device 1 includes the n-type buffer layer instead of the p-type buffer layer 20, and the p-type cap layer instead of the n-type cap layer 80.

Example 2

Figure 5A:
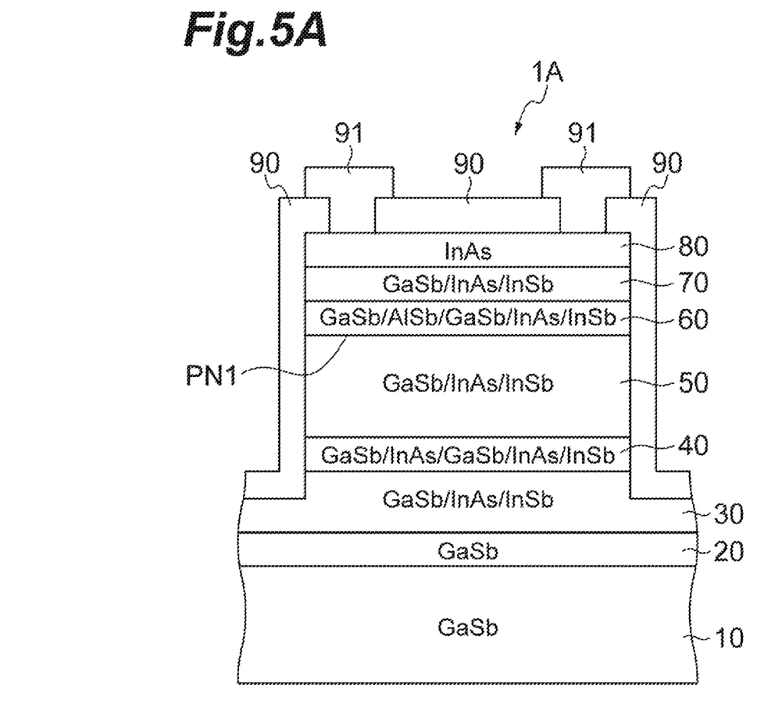
FIG. 5A is a view showing one structure of the optical switching device according to the embodiment.
Figure 5B:
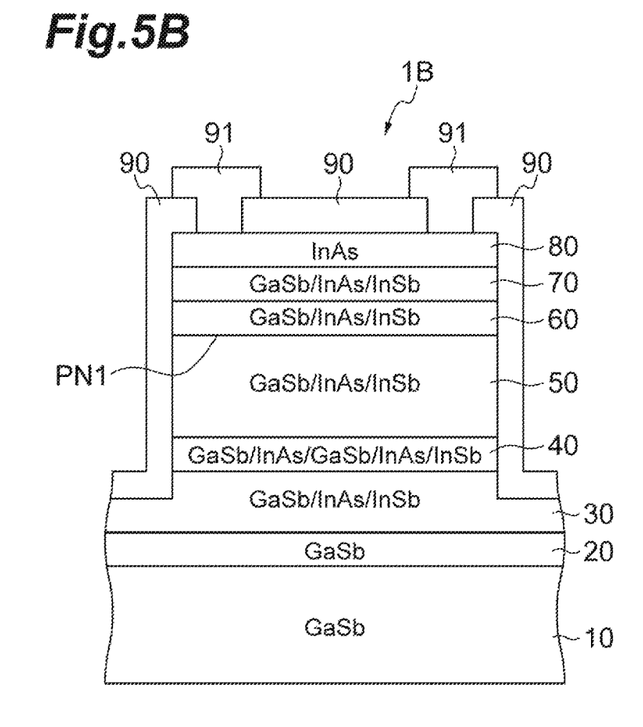
FIG. 5B is a view showing another structure of the optical switching device according to the embodiment.

FIGS. 5A and 5B are schematic views each showing the laminate structure of the optical switching device according to the embodiment. Referring to FIG. 5A, the optical switching device 1A of Example 2 includes a p-type buffer layer 20, a first superlattice layer 30, a second superlattice layer 40, a light absorbing layer 50, an excitation layer 60, a barrier layer 70, and an n-type cap layer 80. The first superlattice layer 30 acts as a p-type contact layer, and the second superlattice layer 40 acts as an electron barrier layer.

An exemplary structure of the optical switching device 1A shown in FIG. 5A
First superlattice layer 30
Laminate structure: Be-doped GaSb/Be-doped InAs/Be-doped InSb.
Be concentration: $1 \times 10^{17}$ to $2 \times 10^{17}$ cm$^{-3}$
Stacking number of unit structures: 50
Thickness: around 250 nm
Second superlattice layer 40
Laminate structure: GaSb/InAs/GaSb/InAs/InSb
Dopant: undoped (n-type conductivity)
Stacking number of unit structures 16
Thickness of the superlattice structure: around 150 nm
Light absorbing layer 50
Superlattice structure: GaSb/Be-doped InAs/InSb
Be concentration: $0.1 \times 10^{16}$ to $1 \times 10^{16}$ cm$^{-3}$
Stacking number of unit structures: 200
Thickness of the superlattice structure: around 1000 nm
Excitation layer 60
Si-doped GaSb/Si-doped AlSb/Si-doped GaSb/Si-doped InAs/Si-doped InSb
Si concentration: around $1 \times 10^{17}$ cm$^{-3}$
Stacking number of unit structures: 100
Thickness of superlattice structure: 300 to 500 nm
Barrier layer 70
GaSb/Si-doped InAs/Si-doped InSb.
Si concentration: $1 \times 10^{17}$ to $5 \times 10^{17}$ cm$^{-3}$
Stacking number of unit structures: 50
Thickness of the superlattice structure: around 250 nm
P-type buffer layer 20
Be-doped GaSb
Be concentration: $1 \times 10^{18}$ to $3 \times 10^{18}$ cm$^{-3}$
Thickness of film: 1 micrometer
N-type cap layer 80
Si-doped InAs
Si concentration: 1 to $3 \times 10^{18}$ cm$^{-3}$
Thickness: 20 nm
Material of substrate 10: Te-doped GaSb
Protective film 90: SiO$_2$, thickness: 300 to 500 nm
First band offset BS1: 30 to 50 meV
Second band offset BS2: 30 to 50 meV
First bandgap EB1: 200 to 225 meV
Second bandgap EB2: 400 to 450 meV
Transition temperature TD: about 100 Kelvin The optical switching device 1A operates according to the transition temperature TD in response to incident light L1 in wavelengths ranging from 2 to 6 micrometers. As described above, the light absorbing layer 50 has p-type conductivity, and the excitation layer 60 and the barrier layer 70 have n-type conductivity. In the optical switching device 1A of Example 2, the light absorbing layer 50 forms a pn-junction PN1 with the excitation layer 60 closest to the light absorbing layer 50. The application of an external voltage causes depletion across the pn-junction PN1, and allows optical excitation of carriers to occur the depleted pn-junction PN1. The carrier concentration of the light absorbing layer 50 is smaller than that of the excitation layer 60.

Example 3

Referring to FIG. 5B, the optical switching device 1B of Example 3 is different from the optical switching device 1A in that the second superlattice structure 60S of the excitation layer 60 has an InSb/InAs/GaSb structure. Thinning the InAs layer in the superlattice of the second superlattice structure 60S can provide the InSb/InAs/GaSb structure of a relatively small doping concentration with a desired band offset in the conduction band.

An exemplary excitation layer 60 in the optical switching device 1B shown in FIG. 5B Excitation layer 60
Si-doped GaSb/Si-doped InAs/Si-doped InSb
Si concentration: $0.1 \times 10^{16}$ to $1 \times 10^{16}$ cm$^{-3}$
Stacking number of unit structures: 100
Thickness of the superlattice structure: around 250 nm
First band offset BS1: 30 to 50 meV
Second band offset BS2: 30 to 50 meV
First bandgap EB1: 200 to 225 meV
Second bandgap EB2: 400 to 450 meV
Transition temperature TD: about 100 Kelvin As described above, the light absorbing layer 50 has p-type conductivity, and the excitation layer 60 and the barrier layer 70 each have n-type conductivity. In the optical switching device 1B of Example 3, the light absorbing layer 50 forms a pn-junction PN1 with the excitation layer 60 closest to the light absorbing layer 50. The application of an external voltage causes depletion across the pn-junction PN1, and allows optical excitation of carriers to occur the depleted pn-junction PN1. The carrier concentration of the light absorbing layer 50 is approximately the same as that of the excitation layer 60. The optical switching device 1B operates in response to incident light L1 having a wavelength of 2 to 6 micrometers.

Figure 6:
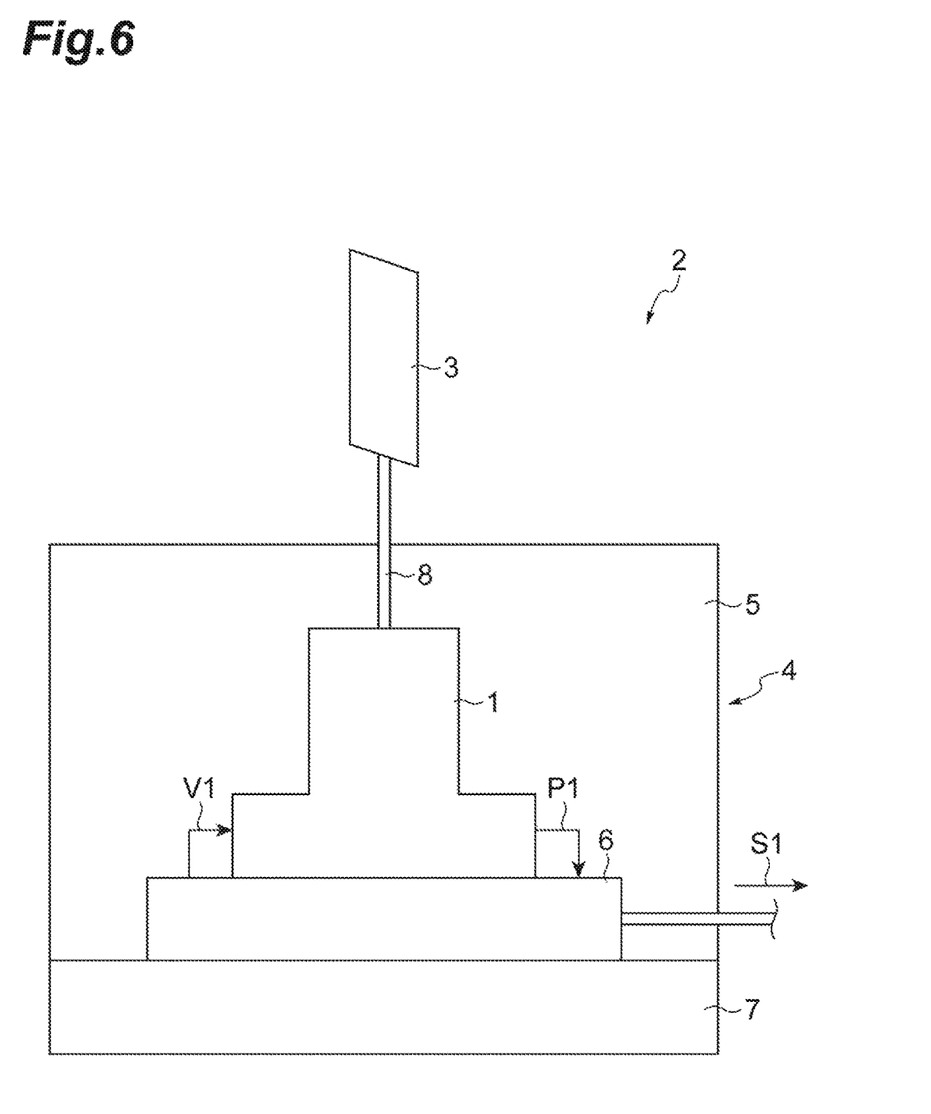
FIG. 6 is a schematic view showing the optical switching apparatus according to the embodiment.

FIG. 6 is a schematic view showing an optical switching apparatus according to the embodiment. The optical switching apparatus 2 includes an optical switching device 1, a housing 4, a heat insulating chamber 5, a control device 6, and a temperature-adjusting device 7, and may further include a light source 3. The temperature-adjustment device 7 controls the temperature of the optical switching device 1 to determine the operating temperature of the optical switching device 1. The temperature-adjustment device 7 can include a cooling device, and the cooling device can change the temperature of the optical switching device 1 and the control device 6. For example, the cooling device mounts the optical switching device 1. The optical switching device 1 is disposed in the heat insulating chamber 5, and is connected to the control device 6. The control device 6 applies, for example, a bias voltage V1 to the optical switching device 1. In addition, the control device 6 receives the photocurrent P1 from the optical switching device 1, and processes the photocurrent P1 to generate an electric signal S1. The control device 6 provides the electric signal Si to the external device. The temperature-adjusting device 7 can change the temperature of the heat insulating chamber 5 in response to a signal from the control device 6. The temperature-adjusting device 7 can change the temperature of atmosphere inside the heat insulating chamber 5 in the range of, for example, 77 to 200 K in absolute temperature.

The optical switching apparatus 2 may further include an optical fiber 8. The light source 3 generates incident light L1, and is optically coupled to the optical switching device 1 such that the incident light L1 can be supplied to the optical switching device 1 through the optical fiber 8. In the present embodiment, the incident light L1 may have a wavelength of, for example, 2 to 6 micrometers. The optical fiber 8 may include a holey fiber.

The major operation of the optical switching device 2 is as follows. The optical switching device 1 is placed at a temperature slightly higher than the transition temperature thereof, so that the optical switching device 1 can generate photocurrent in response to the reception of the incident light L1, and output photocurrent. The optical switching device 1 is placed at a temperature slightly lower than the transition temperature, so that the optical switching device 1 can generate photocurrent in response to the reception of the incident light L1 but does not output the photocurrent.

The optical switching apparatus 2 is operable to output photocurrent upon reception of the incident light L1, and to switch the output of the photocurrent in response to change in temperature across the transition temperature TD.

Figure 7A:
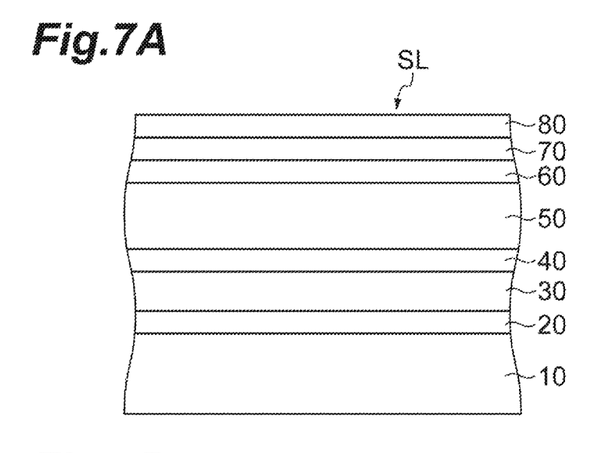
FIG. 7A is a schematic view showing a major step for growing an epitaxial wafer in a method for fabricating the optical switching device according to the embodiment.

A brief description on a method for fabricating an optical switching device will be given below. FIGS. 7A, 7B, 7C, 8A, 8B, 8C, and 8D are schematic views each showing a major step in the method for fabricating the optical switching device according to the embodiment. A substrate 10 of III-V semiconductor is prepared. As shown in FIG. 7A, a III-V semiconductor layer for the p-type buffer layer 20, III-V semiconductor superlattice structures for the first superlattice layer 30, the second superlattice layer 40, the light absorbing layer 50, the excitation layer 60 and the barrier layer 70, and a III-V semiconductor layer for the n-type cap layer 80 are grown on the substrate 10. These steps for growing the semiconductors are performed by, for example, Molecular Beam Epitaxy (MBE) to form a semiconductor laminate SL.

Figure 7B:
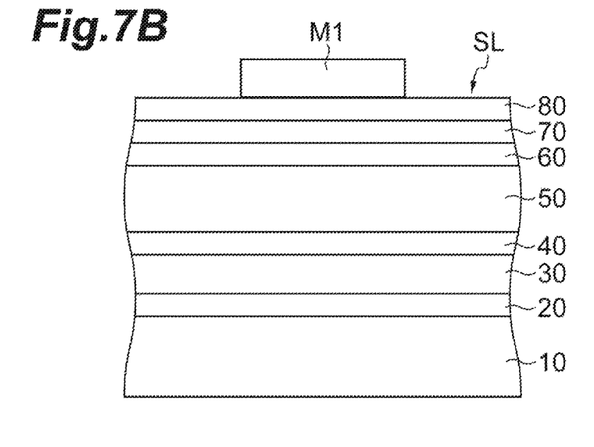
FIG. 7B is a schematic view showing a major step for making a mask on the epitaxial wafer in the method.

An exemplary fabrication condition for the p-type buffer layer 20, the first superlattice layer 30, the second superlattice layer 40, the light absorbing layer 50, the excitation layer 60, the barrier layer 70, and the n-type cap layer 80
Te-doped GaSb Substrate Having a Principal Surface of GaSb (100) Plane
Method for forming films: MBE method
Gallium raw material: solid Ga
Antimony raw material: solid Sb
Indium raw material: solid In
Arsenic raw material: solid As
Beryllium raw material: solid Be
Silicon raw material: solid Si
P-type buffer layer 20: Be-doped GaSb
First superlattice layer 30
Be-doped GaSb/Be-doped InAs/Be-doped InSb superlattice structure
Second superlattice layer 40
Undoped GaSb/undoped InAs/undoped GaSb/undoped InAs/undoped
InSb superlattice structure
Light absorbing layer 50
Be-doped GaSb/Be-doped InAs/Be-doped InSb superlattice structure
Excitation layer 60
Si-doped GaSb/Si-doped AlSb/Si-doped GaSb/Si-doped InAs/Si-doped InSb superlattice structure
Barrier layer 70
Si-doped GaSb/Si-doped InAs/Si-doped InSb superlattice structure
N-type cap layer 80: Si-doped InAs As shown in FIG. 7B, a first mask M1 which defines the shape of the semiconductor mesa MS is formed on the principal surface of the semiconductor laminate SL. The first mask M1 includes, for example, SiN or SiO$_2$.

Figure 7C:
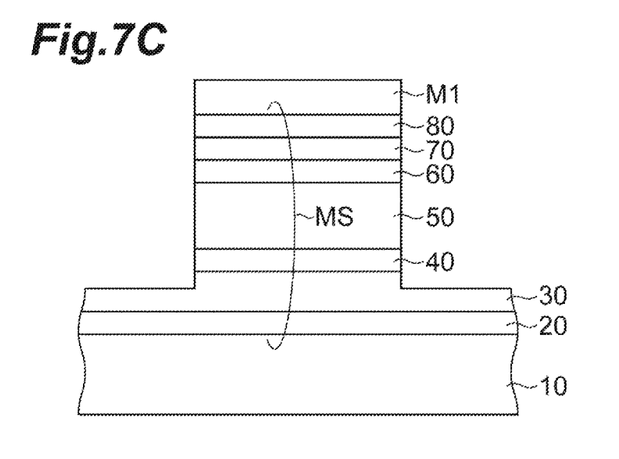
FIG. 7C is a schematic view showing a major step for etching the epitaxial wafer with the mask in the method.

As shown in FIG. 7C, the semiconductor laminate SL is etched with the first mask M1 to form a semiconductor mesa MS. This etching is stopped in the middle of the first superlattice layer 30, and can use a dry etching method and/or a wet etching method. The dry etching uses, for example, hydrogen iodide or silicon chloride gas as etchant, and the wet etching uses, for example, an aqueous solution containing phosphoric acid and hydrogen peroxide water as etchant. Forming the semiconductor mesa MS is followed by removal of the first mask M1.

Figure 8A:
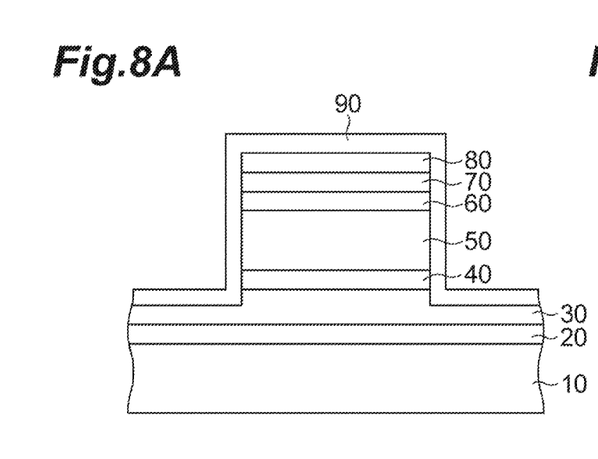
FIG. 8A is a schematic view showing a major step for form an insulating film by chemical vapor deposition in the method.

As shown in FIG. 8A, a protective film 90 is formed so as to cover the semiconductor mesa MS and the first superlattice layer 30 thus etched. The protective film 90 includes, for example, SiN or SiO$_2$, and is formed by a film forming method, such as a plasma CVD.

Figure 8B:
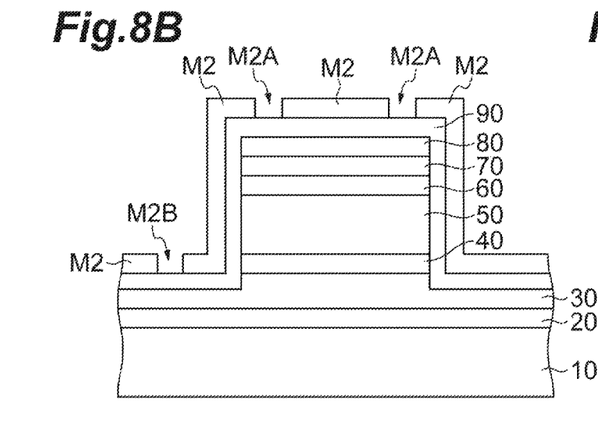
FIG. 8B is a schematic view showing a major step for making contact holes in the insulating film in the method.

As shown in FIG. 8B, a second mask M2 is formed on the protective film 90. The second mask M2 includes, for example, SiN and has openings M2A and M2B. The protective film 90 is etched with the second mask M2. This etching is followed by removal of the second mask M2.

Figure 8C:
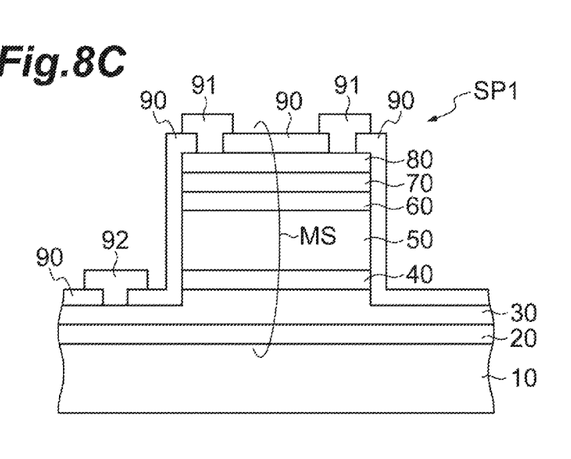
FIG. 8C is a schematic view showing a major step for making electrodes in the method.

As shown in FIG. 8C, a lift-off mask having patterns that define the shapes of the first and second electrodes 91 and 92 is formed on the protective film 90 having the openings M2A and M2B. The lift-off mask has one opening defining the shape of the first electrode 91 and positioned to the opening M2A on the semiconductor mesa MS, and another opening defining the shape of the second electrode 92 and positioned to the opening M2B on the p-type buffer layer 20. Metallic material for the first and second electrodes 91 and 92 is deposited on the lift-off mask and on the substrate. The deposition of material for the first and second electrodes 91 and 92 is performed, for example, by vapor deposition. The metal film thus formed is lifted off to form a substrate product SP1. The first and second electrodes 91 and 92 include, for example, Ti/Pt/Au/Ni Au. The back side of the substrate product SP1 thus produced is polished so that the substrate 10 has a desired thickness. Cleaving the substrate product SP1 thus polished forms semiconductor chips for the optical switching device.

Figure 8D:
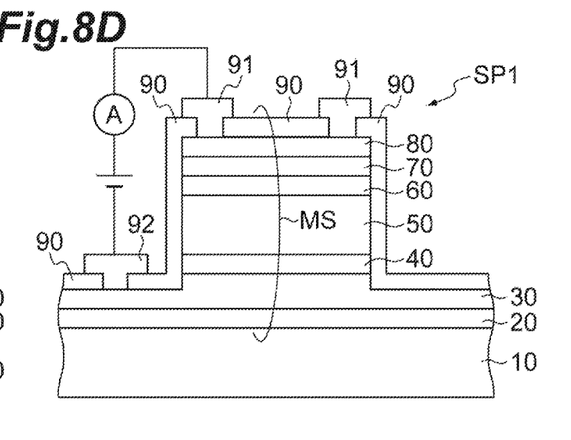
FIG. 8D is a schematic view showing a major step for measuring temperature characteristics of the device thus fabricated to determine the transition temperature thereof in the method.

As shown in FIG. 8D, voltage is applied across the first and second electrodes 91 and 92 to measure the current characteristics of the optical switching device thus fabricated. The measurement results are used to determine the transition temperature TD, which is associated with the internal structure from the distribution of the levels in the excitation layer, characterizing the optical switching device. The measurements are carried out in a temperature range of 70 to 150 K in absolute temperature, where the applied voltage is, for example, 0.2 volt (V).

As described above, the present embodiments can provide an optical switching device that can switch the output of photocurrent in response to change in temperature of the optical switching device, and can provide an optical switching apparatus including the optical switching device.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. An optical switching device comprising:
an optical absorbing layer having a first superlattice structure and responding to an incident light;
an excitation layer having a second superlattice structure and producing an electron by thermal excitation; and
a barrier layer having a third superlattice structure,
the optical absorbing layer and the barrier layer enabling a first band offset and a second band offset to form a well in a conduction band of the second superlattice structure of the excitation layer with reference to a conduction band of the first superlattice structure of the optical absorbing layer and a conduction band of the third superlattice structure of the barrier layer, respectively.

2. The optical switching device according to claim 1, wherein the second superlattice structure of the excitation layer includes an InSb/InAs/GaSb structure.

3. The optical switching device according to claim 1, wherein the third superlattice structure of the barrier layer includes one of an InSb/InAs/GaSb/AlSb/GaSb structure and an InSb/InAs/GaSb structure.

4. The optical switching device according to claim 1, wherein the third superlattice structure of the barrier layer includes an InSb/InAs/GaSb structure.

5. An optical switching apparatus comprising:
an optical switching device; and
a temperature-adjusting device thermally coupled to the optical switching device;
the optical switching device including:
an optical absorbing layer having a first superlattice structure and responding to an incident light;
an excitation layer having a second superlattice structure and producing an electron by thermal excitation; and
a barrier layer having a third superlattice structure, the optical absorbing layer and the barrier layer enabling a first band offset and a second band offset to form a well in a conduction band of the second superlattice structure of the excitation layer with reference to a conduction band of the first superlattice structure of the optical absorbing layer and a conduction band of the third superlattice structure of the barrier layer, respectively.

6. The optical switching apparatus according to claim 5, further comprising an optical fiber optically coupled to the optical switching device.

* * * * *